United States Patent
Pietambaram et al.

(10) Patent No.: US 12,218,040 B2
(45) Date of Patent: Feb. 4, 2025

(54) NESTED INTERPOSER WITH THROUGH-SILICON VIA BRIDGE DIE

(71) Applicant: Intel Corporation, Santa Clara, CA (US)

(72) Inventors: Srinivas V. Pietambaram, Chandler, AZ (US); Debendra Mallik, Chandler, AZ (US); Kristof Darmawikarta, Chandler, AZ (US); Ravindranath V. Mahajan, Chandler, AZ (US); Rahul N. Manepalli, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 819 days.

(21) Appl. No.: 17/186,289

(22) Filed: Feb. 26, 2021

(65) Prior Publication Data
US 2022/0278032 A1    Sep. 1, 2022

(51) Int. Cl.
| H01L 23/538 | (2006.01) |
| H01L 23/00 | (2006.01) |
| H01L 23/498 | (2006.01) |
| H01L 25/065 | (2023.01) |

(52) U.S. Cl.
CPC .. *H01L 23/49822* (2013.01); *H01L 23/49894* (2013.01); *H01L 23/5383* (2013.01); *H01L 24/16* (2013.01); *H01L 25/0652* (2013.01); *H01L 2224/16227* (2013.01)

(58) Field of Classification Search
CPC ......... H01L 23/49822; H01L 23/49894; H01L 23/5383
See application file for complete search history.

(56) References Cited

U.S. PATENT DOCUMENTS

| 9,711,465 | B2 | 7/2017 | Liao et al. |
| 10,535,608 | B1* | 1/2020 | Rubin ............... H01L 24/17 |
| 2015/0235915 | A1* | 8/2015 | Liang ............ H01L 25/0652 361/764 |
| 2018/0204791 | A1* | 7/2018 | Chen ............ H01L 23/49827 |
| 2020/0312766 | A1* | 10/2020 | Bhagavat ......... H01L 21/6836 |
| 2020/0395309 | A1 | 12/2020 | Cheah et al. |

(Continued)

FOREIGN PATENT DOCUMENTS

WO    WO 2021-022150    2/2021

OTHER PUBLICATIONS

International Search Report and Written Opinion for International Patent Application No. PCT/US2022/013929, mailed May 16, 2022, 10 pgs.

*Primary Examiner* — Errol V Fernandes
(74) *Attorney, Agent, or Firm* — Schwabe, Williamson & Wyatt P.C.

(57) ABSTRACT

An electronic package includes an interposer having an interposer substrate, a cavity that passes into but not through the interposer substrate, a through interposer via (TIV) within the interposer substrate, and an interposer pad electrically coupled to the TIV. The electronic package includes a nested component in the cavity, wherein the nested component includes a component pad coupled to a through-component via. A core via is beneath the nested component, the core via extending from the nested component through the interposer substrate. A die is coupled to the interposer pad by a first interconnect and coupled to the component pad by a second interconnect.

25 Claims, 13 Drawing Sheets

(56) References Cited

U.S. PATENT DOCUMENTS

| | | |
|---|---|---|
| 2021/0005542 A1 | 1/2021 | Mallik et al. |
| 2021/0134728 A1* | 5/2021 | Rubin ................. H01L 21/4853 |
| 2021/0305163 A1* | 9/2021 | Akkinepally ....... H01L 23/5381 |
| 2021/0375768 A1* | 12/2021 | Tsou ................. H01L 23/49838 |

* cited by examiner

NESTED INTERPOSER WITH THROUGH-SILICON VIA BRIDGE DIE

TECHNICAL FIELD

Embodiments of the present disclosure relate to electronic packaging, and more particularly, to multi-chip packaging architectures with one or more dies attached to an interposer and one or more components embedded in cavities in the interposer.

BACKGROUND

The demand for increased performance and reduced form factor are driving packaging architectures towards multi-chip integration architectures. Multi-chip integration allows for dies manufactured at different process nodes to be implemented into a single electronic package. However, current multi-chip architectures result in larger form factors that are not suitable for some use cases or are not otherwise desirable to end users.

EMBODIMENTS OF THE DISCLOSURE

Described herein are nested interposers having a through-silicon via bridge die and methods of forming such electronic packages, in accordance with various embodiments. In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

As noted above, current packaging solutions are beginning to use multi-die architectures. However, the inclusion of multiple dies in a single package is not without issue. In addition to the larger footprint of existing multi-die architectures, such systems also suffer from poor yield and reliability. Particularly, the interconnections between dies are difficult to control due to warpage and other alignment issues when using traditional packaging substrates. Accordingly, embodiments disclosed herein include electronic packages that utilize nested interposers with through-silicon via (TSV) Si bridge dies for fine bump pitch die-to-die tiling.

To provide context, nested interposers can include an interposer with one or more cavities. Nested components may be positioned in the cavities. One or more dies may be connected to the interposer and the nested components with interconnects. In an embodiment, the interconnects include intermediate pads that are positioned between the pads of the nested component and the die and between the pads of the interposer and the die. In some embodiments, the intermediate pads are connected to the interposer pads and the nested component pads by a via. In other embodiments, the intermediate pads are directly connected to the interposer pads and the nested component pads. The intermediate pads (and in some embodiments the vias) provide misalignment correction for misalignment between the interposer and the nested component. Accordingly, embodiments allow for high yields and reliability, even when fine pitched interconnects are used (e.g., when the nested component is a bridge between two dies).

Figure 1A:
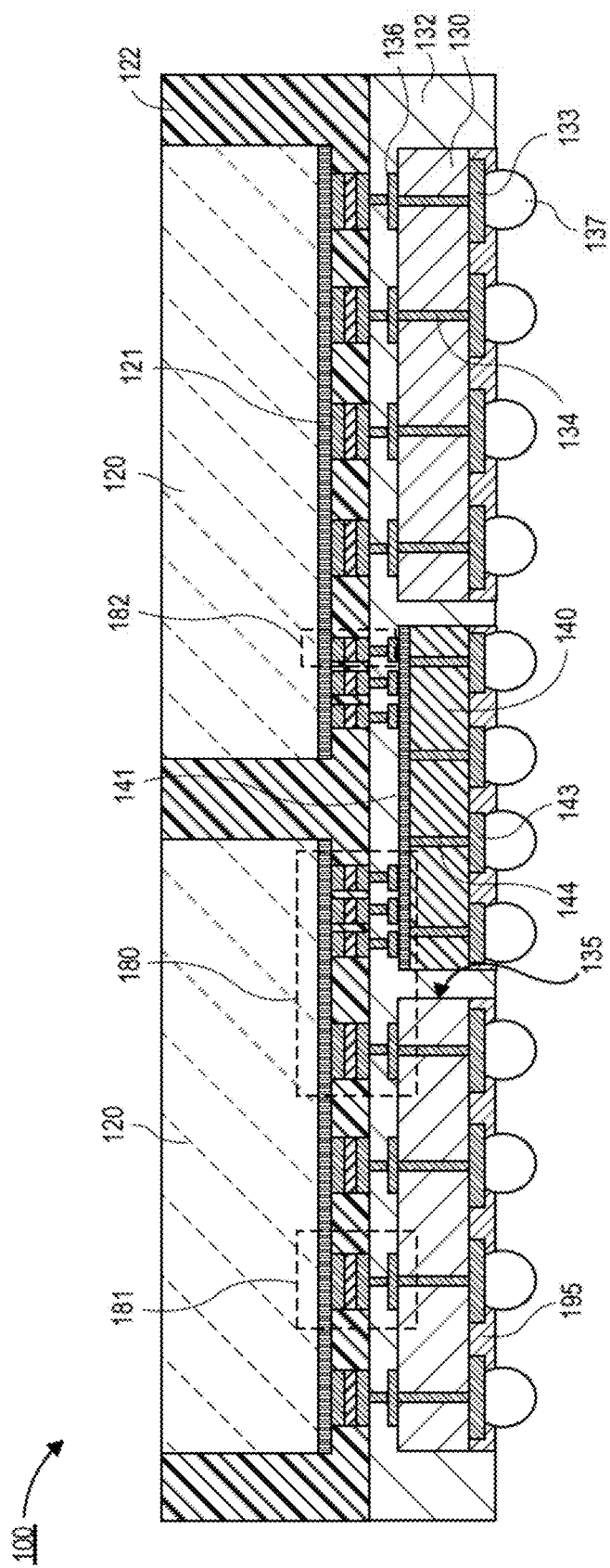
FIG. 1A is a cross-sectional illustration of an electronic package that includes a heterogeneous nested interposer, in accordance with an embodiment.

Referring now to FIG. 1A, a cross-sectional illustration of an electronic package 100 is shown, in accordance with an embodiment. In an embodiment, the electronic package 100 may include an interposer 130 and a nested component 140. The nested component 140 is positioned within a cavity 135 that passes through the interposer 130. The nested component 140 is referred to as being "nested" because the component 140 is placed into the cavity 135. That is, the nested component 140 is surrounded by portions of the interposer 130. In the illustrated embodiment, a single cavity 135 is shown in the interposer 130. However, it is to be appreciated that any number of cavities 135 may be used, depending on the device. Examples of multiple cavities 135 are provided below in greater detail. In the illustrated embodiment, a single nested component 140 in the cavity 135 is shown. However, it is to be appreciated that any number of nested components 140 may be positioned in a single cavity 135. Examples of multiple nested components 140 in a single cavity 135 are provided below in greater detail.

In an embodiment, the interposer 130 may be any suitable substrate material. For example, the interposer 130 may be or include a substrate including glass, ceramic, semiconductor materials (e.g., high or low resistivity silicon, group III-V semiconductors, or the like), or organic substrates (high density interconnect (HDI) substrates, embedded trace substrates (ETS), high density package (HDP) substrates, molded substrates, or the like). In some embodiments, the interposer 130 is a passive device. That is, the interposer 130 may include only passive components (e.g., traces, vias, etc.). For example, the interposer 130 may include vias 134 that provide connections between pads 133 below the interposer 130 and pads 136 above the interposer 130. In other embodiments, the interposer 130 may be an active interposer. That is, the interposer 130 may include active devices (e.g., transistors etc.).

In an embodiment, the nested component 140 may be an active or passive component. For example, an active nested component 140 may include logic devices, analog/RF devices, I/O circuits, memory devices, voltage regulators, sensors, or the like. Passive nested components 140 may include high density multi-die interconnect bridge dies, capacitors, inductors, resistors, thermo-electric coolers, high speed connectors, or the like. In the illustrated embodiment, the nested component 140 includes an active surface 141. While referred to as an "active" surface 141, it is to be appreciated that the active surface 141 may include entirely passive features. In an embodiment, the nested component 140 may include through component vias (TCVs) 144. The TCVs 144 may electrically couple the active surface 141 to pads 143 on the backside of the nested component 140.

In an embodiment, the interposer 130 and the nested component 140 may be embedded by a mold layer 132. The mold layer 132 may fill the remaining portions of the cavity 135. That is, portions of the mold layer 132 may be positioned between sidewalls of the nested component 140 and sidewalls of the interposer 130. In an embodiment, the mold layer 132 may cover top surfaces of the nested component 140 and top surfaces of the interposer 130.

In an embodiment, pads 133 of the interposer 130 and pads 143 of the nested component 140 may be contacted by bumps 137 positioned in openings through a solder resist 195 around the pads 133 and the pads 143. In an embodiment, the bumps 137 may be referred to as "package side bumps" (PSBs). The PSBs may interface with a package substrate (not shown).

In an embodiment, the electronic package 100 may further include one or more dies 120 embedded in a mold layer 122. In an embodiment, the active surfaces 121 of the dies 120 may be electrically coupled to the interposer 130 and the nested component 140. For example, interconnects 181 provide electrical connections between the die 120 and the interposer 130, and interconnects 182 provide electrical connections between the die 120 and the nested component 140. In an embodiment, the interconnects 181 may have a different pitch than the interconnects 182. For example, the interconnects 182 may have a smaller pitch than the interconnects 181. In the illustrated embodiment, the nested component 140 is a bridge that provides an electrical connection between the two dies 120.

Figure 1B:
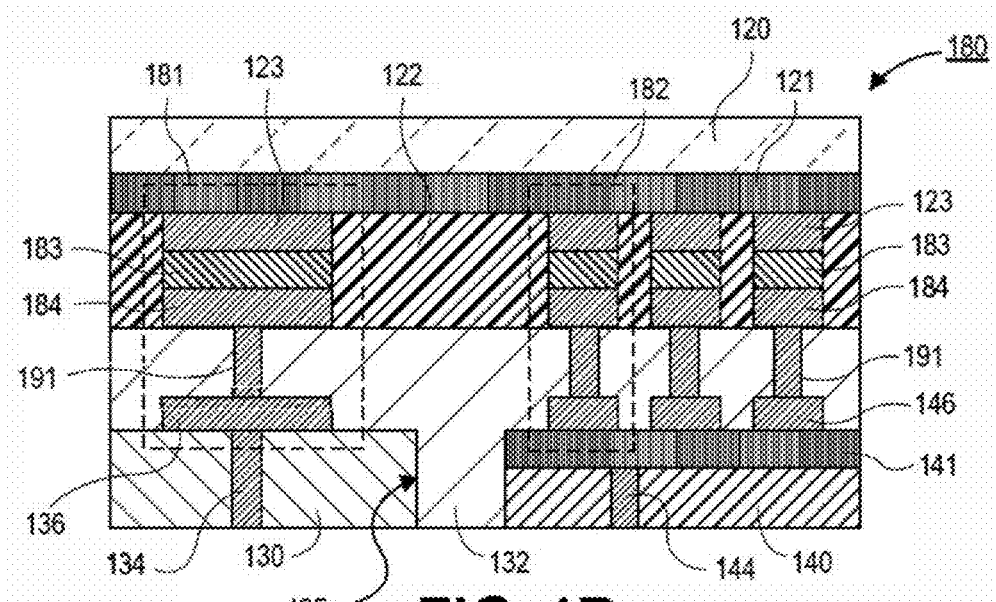
FIG. 1B is a zoomed in portion of FIG. 1A that more clearly illustrates the interconnects between the die and the interposer and the die and a nested component, in accordance with an embodiment.

Referring now to FIG. 1B, a zoomed in portion 180 of the electronic package 100 is shown, in accordance with an embodiment. Portion 180 illustrates more clearly the architecture of the interconnects 181 and 182. As shown, the interconnects 181 and 182 are substantially similar to each other, with the exception that the widths of the interconnects 182 are smaller than the widths of the interconnects 181. In an embodiment, the interconnects include an intermediate pad 184. The intermediate pads 184 may be positioned over a top surface of the mold layer 132. A bump 183 (e.g., a solder bump) may be positioned over the intermediate pads 184. The bumps 183 may be electrically coupled to die pads 123 of the die 120.

In an embodiment, the intermediate pads 184 may be electrically coupled to interposer pads 136 or component pads 146 by vias 191. The vias 191 may extend through a portion of the mold layer 132. In the illustrated embodiment, the vias 191 are illustrated as having substantially vertical sidewall profiles. Such an embodiment may be provided when the via openings are lithographically defined. However, it is to be appreciated that embodiments may also include vias 191 with tapered sidewall profiles. Such embodiments are typically formed when the via openings are formed with a laser drilling process.

The use of intermediate pads 184 and vias 191 provides interconnects 181 and 182 that have an improved alignment to the die 120. Particularly, since the nested component 140 is placed into the cavity 135 of the interposer 130, there may be some degree of misalignment between the interposer pads 136 and the component pads 146. However, since the vias 191 may all be formed with a single lithography operation, they will be aligned with each other. Similarly, the intermediate pads 184 may be fabricated with a single lithography process that aligns the intermediate pads 184 to each other. In FIG. 1B, the interposer 130, the nested component 140, and the die 120 are shown as being perfectly aligned, and the benefit of alignment correction capabilities of the interconnects 181 and 182 are not clearly evident.

Figure 1C:
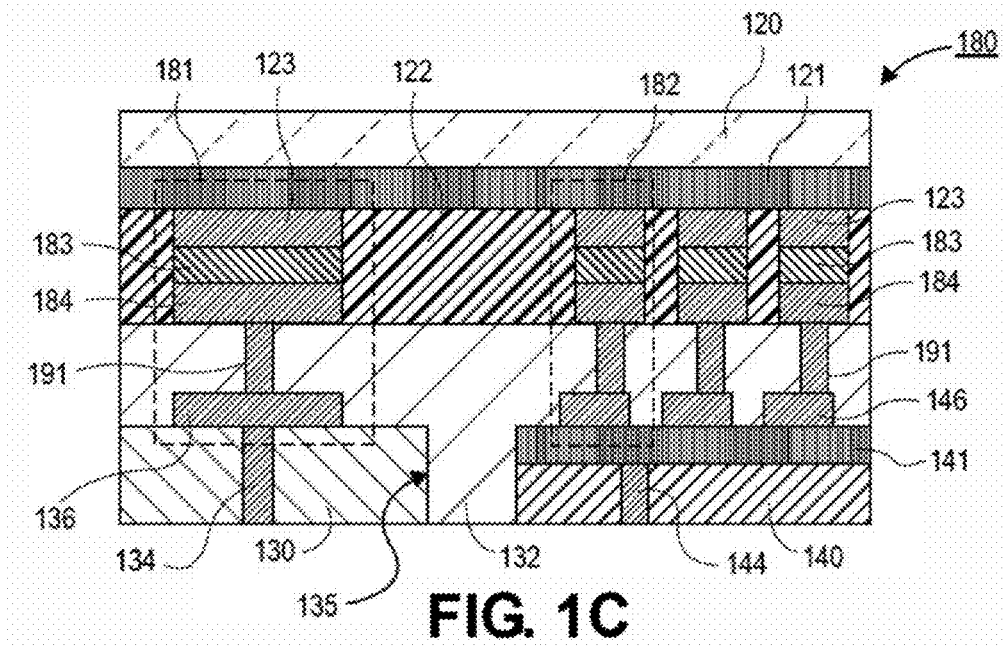
FIG. 1C is a zoomed in portion of FIG. 1A that illustrates an alignment correction provided by the interconnects attached to the interposer and the nested component, in accordance with an embodiment.

Referring now to FIG. 1C, a cross-sectional illustration of the portion 180 that more clearly exhibits the benefits of the alignment correction features is shown, in accordance with an embodiment. As shown in FIG. 1C, the nested component 140 is offset from the center of the cavity 135. Accordingly, the component pads 146 are misaligned with respect to the interposer pads 136. However, the vias 191 are all aligned with respect to each other, and the intermediate pads 184 are all aligned with respect to each other. For example, the centerlines of the vias 191 over the component pads 146 are not aligned with the centerlines of the component pads 146. So long as the vias 191 land on some surface of the component pads 146 (without also landing on a neighboring component pad 146) the misalignment can be corrected. In FIG. 1C, the centerline of the via 191 over the interposer pad 136 is shown as being substantially aligned with the centerline of the interposer pad 136. However, it is to be appreciated that the via 191 may be shifted with respect to the interposer pad 136 in some embodiments.

In FIG. 1C, misalignment in the X direction is shown. That is, the vias 191 may provide misalignment correction in the X-Y plane. However, it is to be appreciated that the vias 191 may also provide Z-height corrections as well. For example, if the thickness of the interposer 130 and the nested component 140 are not uniform, then vias of different heights can be used to provide a uniform Z-height for subsequent connections.

Figure 2A:
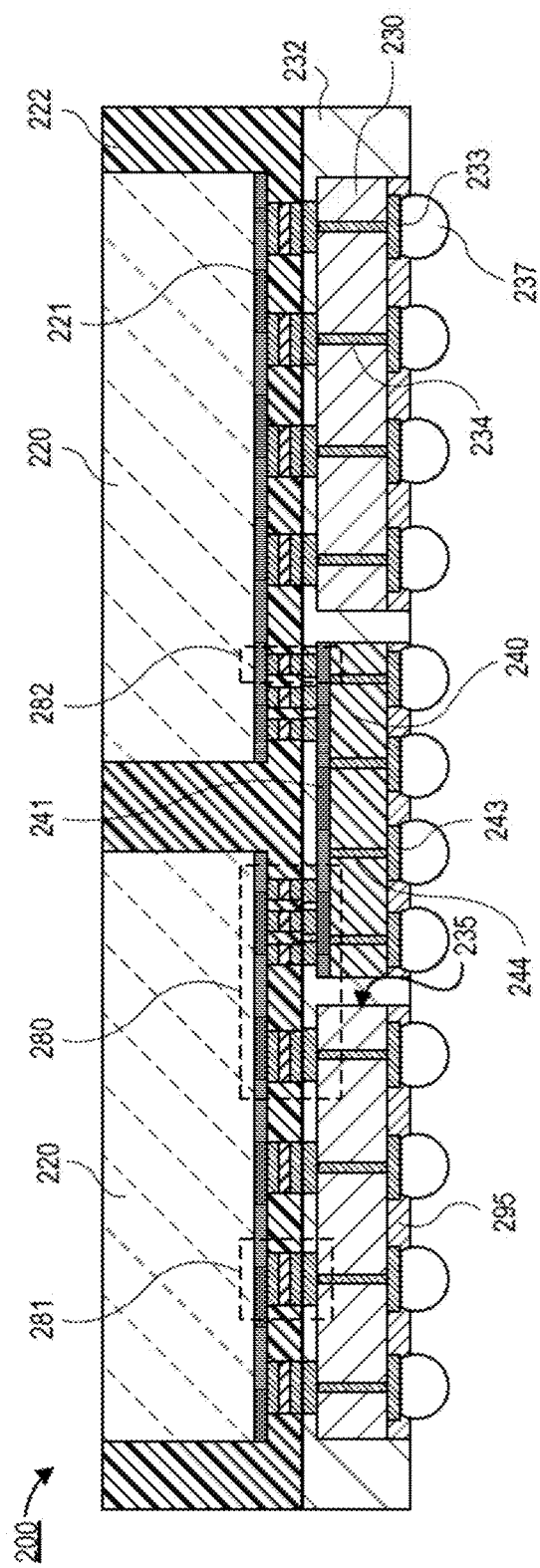
FIG. 2A is a cross-sectional illustration of an electronic package that includes a heterogeneous nested interposer, in accordance with an embodiment.

Referring now to FIG. 2A, a cross-sectional illustration of an electronic package 200 is shown, in accordance with an additional embodiment. In an embodiment, the electronic package 200 may be substantially similar to the electronic package 100 described above, with the exception that the interconnects 281 and 282 are modified. For example, the electronic package 200 may include an interposer 230 with a cavity 235 and a nested component 240 in the cavity 235. The interposer 230 and the nested component 240 may be embedded in a mold layer 232. Active surfaces 221 of the dies 220 may be connected to the interposer 230 and the nested component 240 by interconnects 281 and 282. The dies 220 may be embedded in a mold layer 222. In an embodiment, the interposer 230 may include vias 234 that provide connection to pads 233 and bumps 237, and the nested component 240 may include vias 244 that connect an active surface 241 to pads 243 and bumps 237. Solder resist 295 may be positioned around the pads 233 and 243.

Figure 2B:
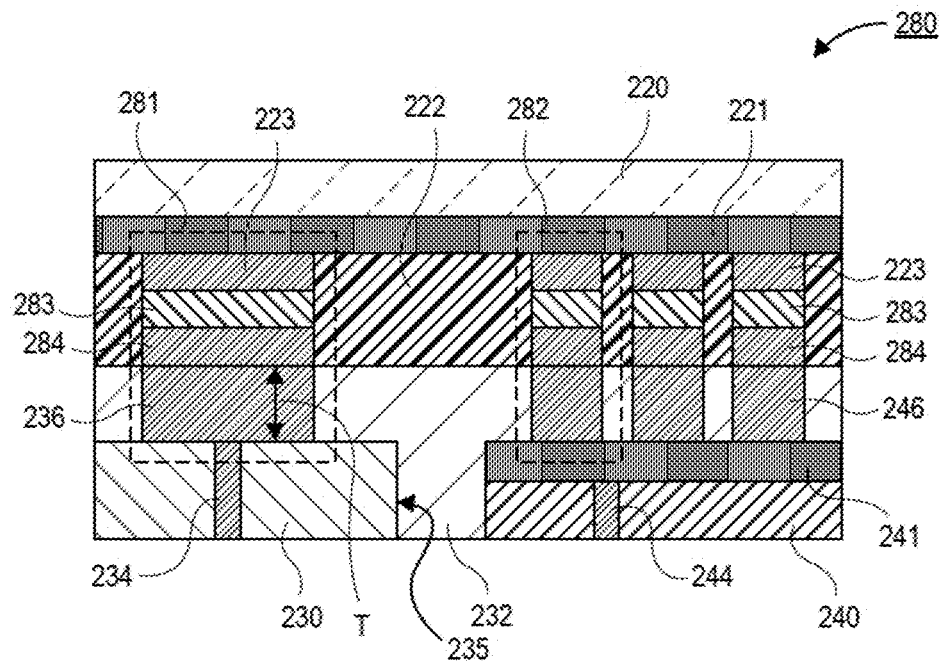
FIG. 2B is a zoomed in portion of FIG. 2A that more clearly illustrates the interconnects between the die and the interposer and the die and a nested component, in accordance with an embodiment.

Referring now to FIG. 2B, a zoomed in cross-sectional illustration of region 280 in FIG. 2A that more clearly illustrates the interconnects 281 and 282 is shown, in accordance with an embodiment. As shown, the interconnects 281 and 282 are substantially similar to each other, with the exception that the widths of the interconnects 282 are smaller than the widths of the interconnects 281. In an embodiment, the interconnects include an intermediate pad 284. The intermediate pads 284 may be positioned over a top surface of the mold layer 232. A bump 283 (e.g., a solder bump) may be positioned over the intermediate pads 284. The bumps 283 may be electrically coupled to die pads 223 of the die 220.

In an embodiment, the intermediate pads 284 may be directly connected to interposer pads 236 or component pads 246. Instead of using vias (as shown in FIGS. 1A-1C), the interposer pads 236 and the component pads 246 have a thickness T that extends through the mold layer 232. Accordingly, the interposer pads 236 and the component pads 246 provide the same functionality provided by the vias 191 in FIGS. 1A-1C.

The use of intermediate pads 284 provides interconnects 281 and 282 that have an improved alignment to the die 220. Particularly, since the nested component 240 is placed into the cavity 235 of the interposer 230, there may be some degree of misalignment between the interposer pads 236 and the component pads 246. However, since the intermediate pads 284 may all be formed with a single lithography operation, they will be aligned with each other. In FIG. 2B, the interposer 230, the nested component 240, and the die 220 are shown as being perfectly aligned, and the benefit of alignment correction capabilities of the interconnects 281 and 282 are not clearly evident.

Figure 2C:
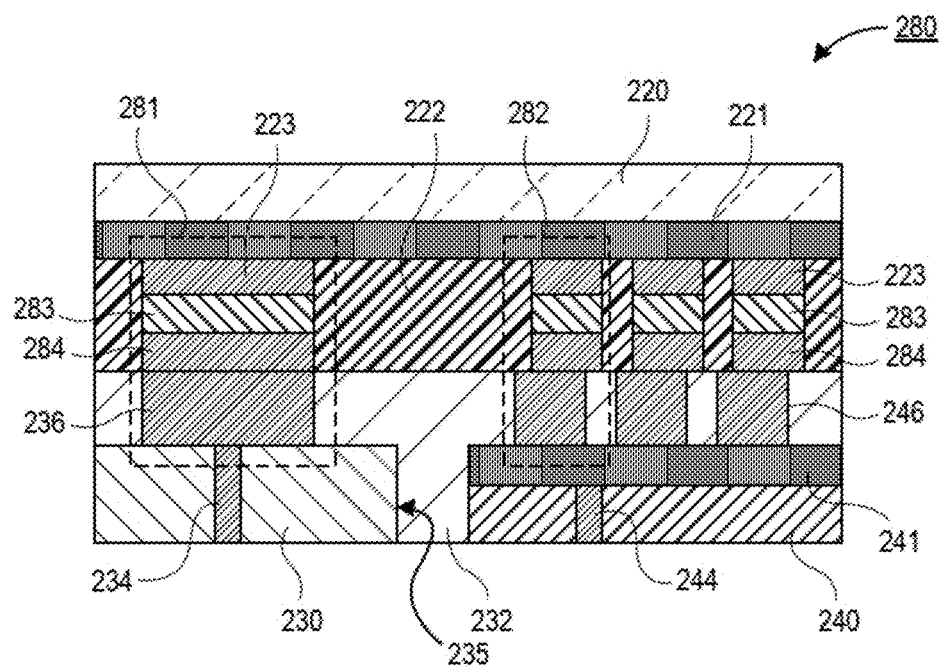
FIG. 2C is a zoomed in portion of FIG. 2A that illustrates an alignment correction provided by the interconnects attached to the interposer and the nested component, in accordance with an embodiment.

Referring now to FIG. 2C, a cross-sectional illustration of the region 280 that more clearly exhibits the benefits of the alignment correction features is shown, in accordance with an embodiment. As shown in FIG. 2C, the nested component 240 is offset from the center of the cavity 235. Accordingly, the component pads 246 are misaligned with respect to the interposer pads 236. However, the intermediate pads 284 are all aligned with respect to each other. For example, the centerlines of the intermediate pads 284 over the component pads 246 are not aligned with the centerlines of the component pads 246. So long as the intermediate pads 284 land on some surface of the component pads 246 (without also landing on a neighboring component pad 246) the misalignment can be corrected. In FIG. 2C, the centerline of the intermediate pad 284 over the interposer pad 236 is shown as being substantially aligned with the centerline of the interposer pad 236. However, it is to be appreciated that the intermediate pad 284 may be shifted with respect to the interposer pad 236 in some embodiments.

In FIG. 2C, misalignment in the X direction is shown. That is, the intermediate pads 284 may provide misalignment correction in the X-Y plane. However, it is to be appreciated that thick interposer pads 236 and component pads 246 may also provide Z-height corrections as well. The use of interposer pads 236 and component pads 246 to provide Z-height corrections will be described in greater detail below.

In another aspect, the demand for miniaturization of form factor and increased levels of integration for high performance are driving sophisticated packaging approaches in the semiconductor industry. Die partitioning enables miniaturization of small form factor and high performance without yield issues seen with other methods but needs fine die to die interconnections. Embedded Multi-die Interconnect Bridge (EMIB) is a breakthrough that enables a lower cost and simpler 2.5D packaging approach for very high-density interconnects between heterogeneous dies on a single package. Instead of an expensive silicon interposer with TSV (through silicon via), a small silicon bridge chip is embedded in the package, enabling very high-density die-to-die connections only where needed. Standard flip-chip assembly is used for robust power delivery and to connect high-speed signals directly from chip to the package substrate.

For future generations of die partitioning, several bridges that can connect the dies at much finer bump pitches (e.g., 25 microns or lower) than that are currently delivered by EMIB are needed. However, the EMIB approach can suffer from a high cumulative Bump Thickness Variation (BTV) and as the number of bridges to be embedded increase, cost of embedding and yields can suffer. Alternate architectures such as patch approaches have been proposed. One patch approach can involve an EMIB-T (EMIB with TSV connections) or an active functional die instead of a standard bridge die with no TSV connections. Fine die-to-die interconnections for die tiling can be accomplished through this embedded die. A patch can be simplified to have no multiple redistribution layer (RDL) routing or fanout layers due to assembly concerns of attaching the patch to the bottom substrate (mid-level interconnect, MLI). While mass reflow is not feasible, significant flattening issues that arise due to the stack warpage can result in a very narrow Thermal Compression Bonding (TCB) attach window. Fabrication of a nested interposer package with glass can result in significant decrease in the warpage but the architecture may not be suitable for EMIB-T or an active die which are usually thinner, and the warpage advantage from nesting diminishes with reduced interposer thickness. To realize the full potential of the nested interposer architecture, in accordance with one or more embodiments of the present disclosure, an EMIB-T or an active die is nested while retaining the warpage benefits from having a thick interposer for MLI attach to the bottom substrate.

Embodiments described herein can be implemented to enable fabrication of a nested interposer architecture that can accommodate a thin EMIB-T or active die for fine bump pitch D2D interconnections. The nesting in this case is performed using a cavity of desired thickness in which the EMIB-T or active die are placed. The TSV connections of the die embedded in the cavity to the bottom substrate can be accomplished through metallized vias created under the cavity. Other top die connections to bottom substrate can be handled through vias in the non-cavity regions of the interposer.

To provide further context, several approaches are being investigated to enable die tiling but none of them offer or provide a robust warpage mitigation solution for reliable MLI attach which is a need for fabricating the final package. A nested interposer package described above can provide significant warpage reduction and render mass reflow feasible at desired no fan-out pitch. Mechanical data collected with a configuration simulating nested glass interposer reveals that the glass thickness needed may be about 350 μm for low warpage. However, a through cavity configuration may not be amenable for embedding EMIB-T or active die. Additionally, equipment and process improvements may only result in limited improvements in patch attach window while changes in material formulations for reducing patch warpage may have undesirable effects or even not possible in some occasions. While warpage improves significantly for a nested interposer, making mass reflow attach process feasible, thickness of the glass and a through cavity configuration may not be suitable for embedding EMIB-T or active die.

In accordance with one or more embodiments of the present disclosure, a nested interposer architecture has a cavity with desired thickness in which the EMIB-T or active die are placed. The TSV connections of the die embedded in the cavity to the bottom substrate are accomplished through metallized vias created under the cavity. Other top die connections to bottom substrate are handled through vias in the non-cavity regions of the interposer. A patch with this configuration may be implemented to not only provide desired low warpage for robust MLI attach but also accommodate an active or EMIB-T die.

To provide further context, a modular die approach or die partitioning is becoming an increasing need in the packaging industry as it enables heterogeneous die integration, miniaturization of form factor and high performance with improved yield. Multiple approaches have been proposed to interconnect the modular die; however, each of the approaches come with their own drawbacks. Embodiments described herein may be implemented to offer a low cost, mature and high yield approach to overcome the issues described above and can be adopted by a variety of applications needing high density die-die interconnections.

A process flow can be implemented for creating packages in a high volume manufacturing (HVM) glass panels processing line, such as for creating a nested interposer with EMIB-T or active die for fine die to die (D2D) tiling. As an exemplary process flow, FIGS. 3A-3K illustrate cross-sectional views representing various operations in a method of fabricating a nested interposer having a through-silicon via bridge die, in accordance with an embodiment of the present disclosure.

Figure 3A:
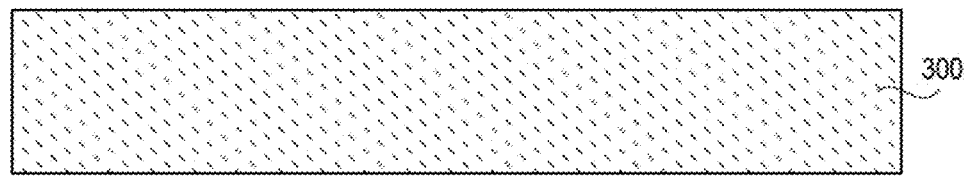
FIGS. 3A-3K illustrate cross-sectional views representing various operations in a method of fabricating a nested interposer having a through-silicon via bridge die, in accordance with an embodiment of the present disclosure.

Referring to FIG. 3A, a glass substrate or panel 300 is selected or fabricated to have a desired final interposer thickness. It is to be appreciated that the glass substrate or panel 300 may be panel level, sub-panel level, wafer-level, etc. The glass substrate or panel 300 is drilled to provide patterned glass substrate 300A having openings 302 therein, as is depicted in FIG. 3B.

Figure 3B:
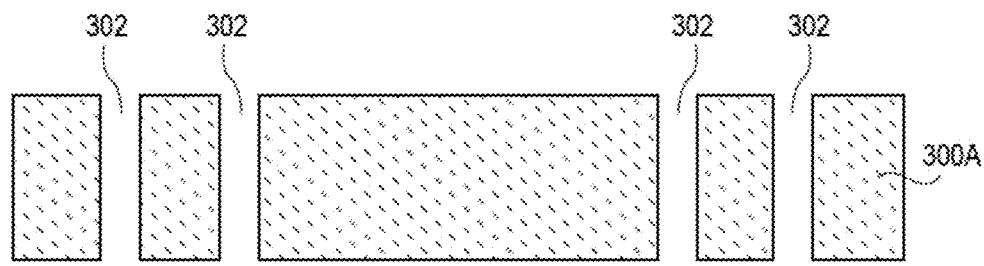
Figure 3C:
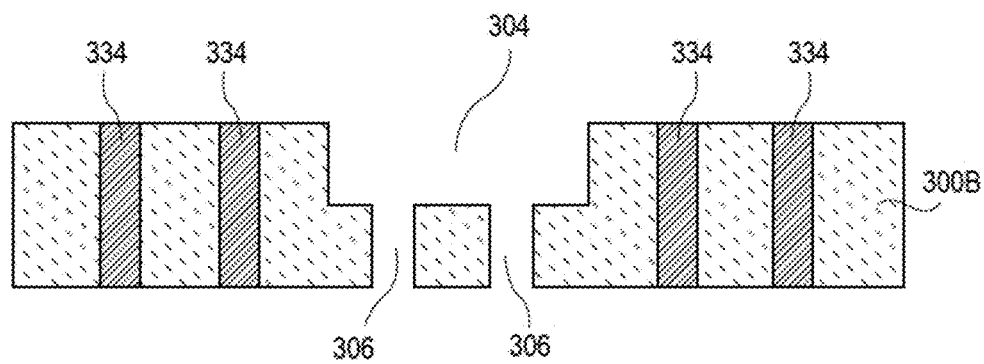
Figure 3D:
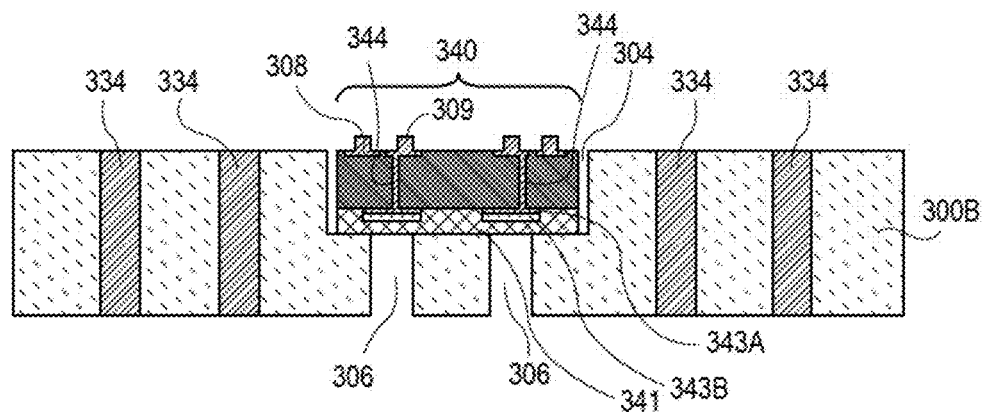

Referring to FIG. 3C, the openings 302 of FIG. 3B are plated to form vias 334, which may be referred to as through interposer vias or through glass vias. A cavity 304 and openings 306 are then drilled into the patterned glass substrate 300A to form twice patterned glass substrate 300B. A component 340 is then placed into the cavity 304, as is depicted in FIG. 3D. In one embodiment, the component 340 is an EMIB-T (through silicon via bridge die) or an active die. In one embodiment, the component 340 through component vias 344 coupled to backside die pads 343A and bumps 343B covered in a backside dielectric 341, e.g., a die bonding film (DBF). The front side of the component can include front side die pads 308 and front side pillars 309.

Figure 3E:
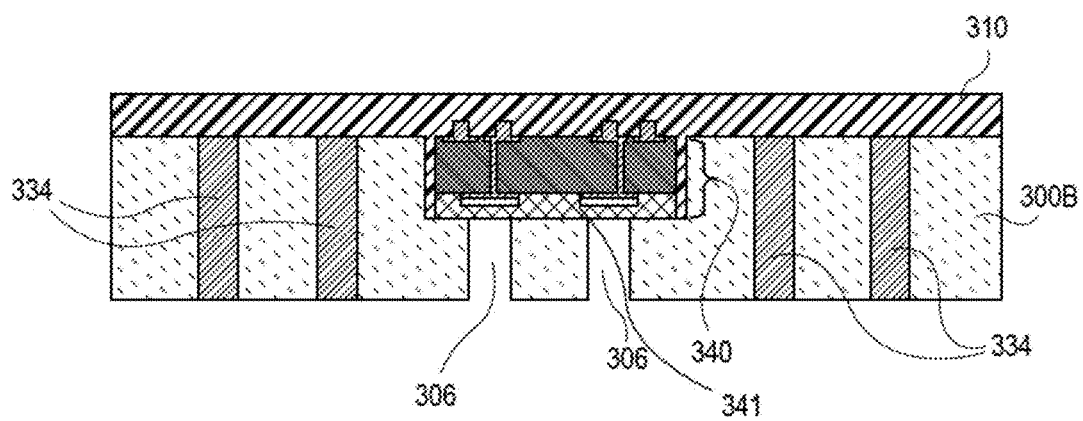
Figure 3F:
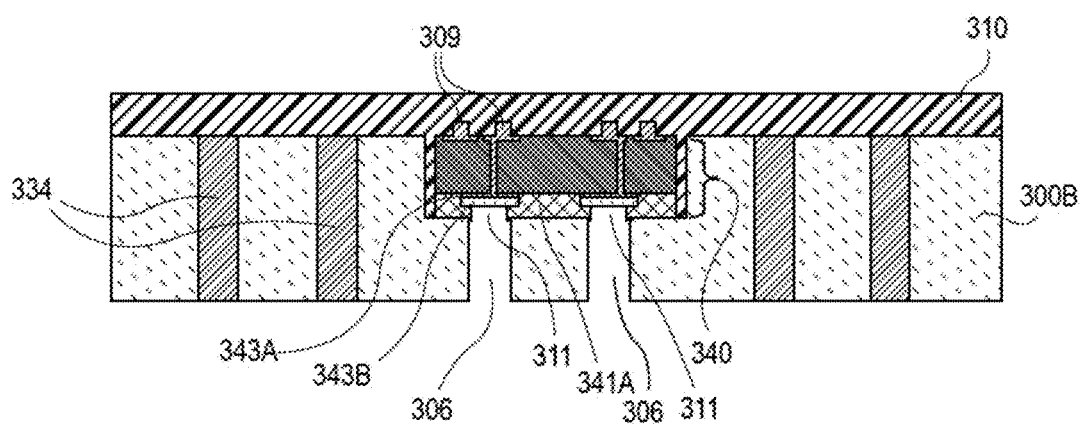

Referring to FIG. 3E, a dielectric layer 310 is disposed over the exposed surfaces. In an embodiment, the dielectric layer 310 embeds the glass substrate 300B and the nested component 340. For example, the dielectric layer 310 may fill the cavity 304 so that portions of the dielectric layer 310 fill space between sidewalls of the nested component 340 and sidewalls of the glass substrate 300B. While referred to as a "dielectric layer," it is to be appreciated that dielectric layer 310 may be any suitable material or formed with any suitable material deposition process for packaging applications. For example, the dielectric layer 310 may be formed with a molding process, a lamination process, a deposition process, or the like. The backside dielectric 341 of the component 340 is then etched through openings 306 to form openings 311 exposing a portion of the bumps 343B, as is depicted in FIG. 3F. In one embodiment, the dielectric layer 310 protects the front side bumps 309 during the etching to form openings 311.

Figure 3G:
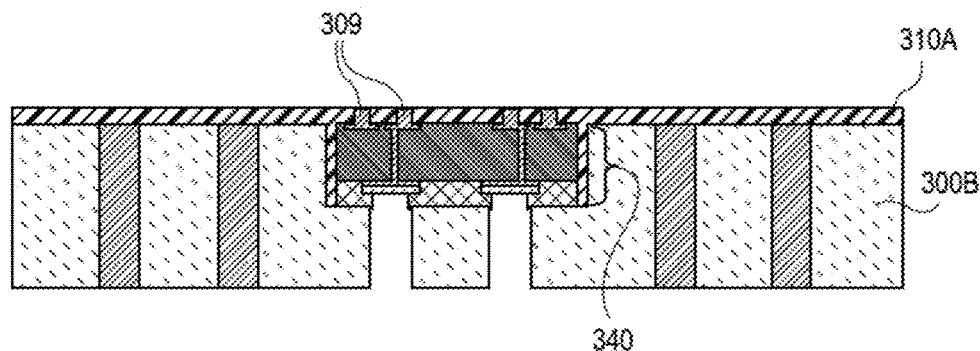
Figure 3H:
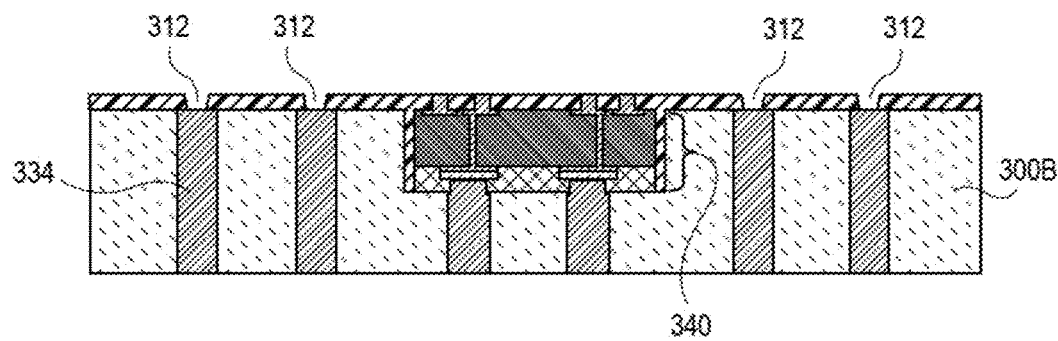

Referring to FIG. 3G, the dielectric layer 310 is then thinned to form thinned dielectric layer 310A revealing the tops of the front side bumps 309 of the component 340. Openings 312 are then formed in the thinned dielectric layer 310A to expose vias 334, as depicted in FIG. 3H.

Figure 3I:
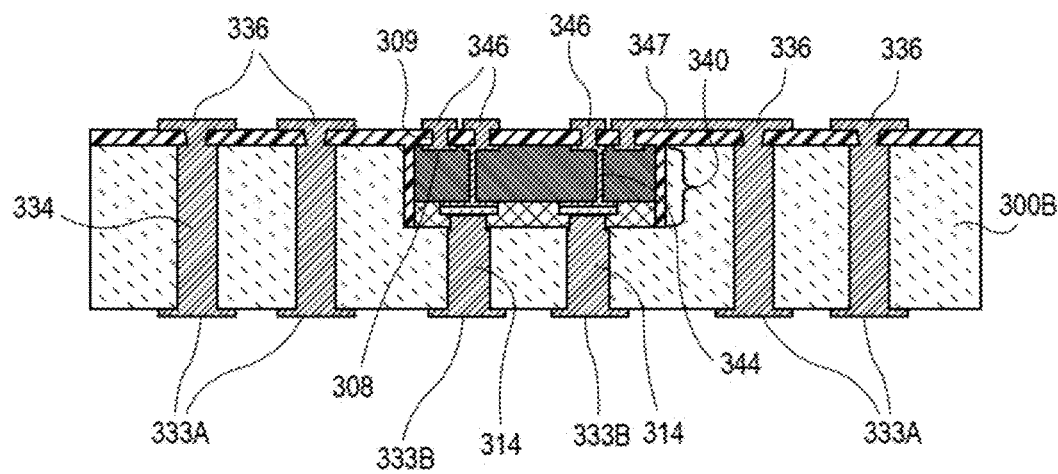

Referring to FIG. 3I, plating and/or semi-additive processing is then performed to form, on the front side, interposer pads 336, component pads 346, and traces 347. Semi-additive processing can also be performed to form, on the backside, core vias 314 beneath the component 340, backside interposer pads 333A and 333B. The backside interposer pads 333B are coupled to the core vias 314. Two-sided solder resist lamination is then performed to form front side solder resist layer 316A and backside solder resist layer 316B, as is depicted in FIG. 3J.

Referring again to FIG. 3J, an interposer 389 includes the front side solder resist layer 316A covering the interposer pads 336 and the component pads 346. Vias 391A and 391B are formed in the front side solder resist layer 316A and are coupled to the interposer pads 336 and component pads 346, respectively. Intermediate pads 384 are then formed on the front side solder resist layer 316A and are coupled to the vias 391A and 391B. Bumps 383 are formed on the intermediate pads 384. Die pads 323 are formed on the intermediate pads 384. Interposer 389 also includes the backside solder resist layer 316B covering the backside pads 333A and 333B. Vias 318A and 318B are formed in the backside solder resist layer 316B and are coupled to the backside pads 333A and 333B, respectively. Intermediate pads 319A are then formed on the backside solder resist layer 316B and are coupled to the vias 318A and 318B. Bumps 319B are formed on the intermediate pads 319A. Package substrate pads 319C are formed on the intermediate pads 319A.

Figure 3J:
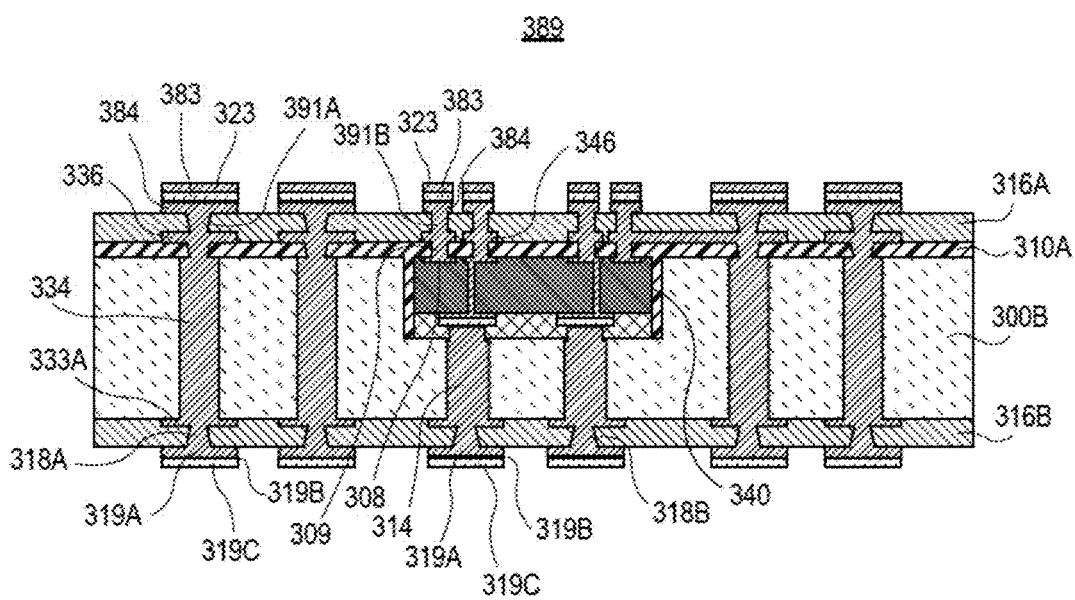
Figure 3K:
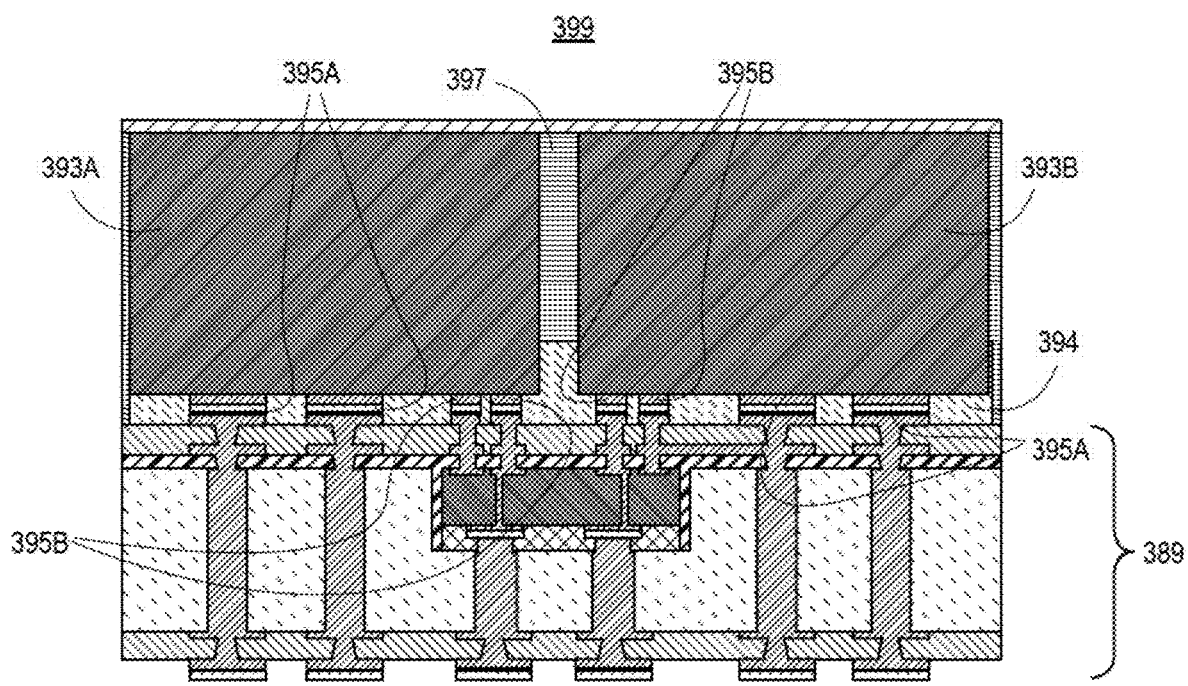

Referring to FIG. 3K, a multi-chip structure 399 is formed by coupling dies 393A and 393B to the interposer 389 of FIG. 3J. The dies 393A and 393B can include bumps 395A and 395B for coupling to die pads 323 of the interposer 389. The bumps 395A are over and may be coupled to the vias interposer substrate, while the bumps 395B are over and may be coupled to the component 340. The multi-chip structure 399 can also include an underfill 394 and/or an over die mold 397, as is depicted.

In accordance with an embodiment of the present disclosure, with reference again to FIGS. 3A-3K, for the sake of simplicity, a single interposer formation is shown. However, multiple interposers may be formed on a panel. A process flow can begin with a panel level glass of desired thickness and CTE (e.g., low CTE of about 3.4 or less). First, core vias (e.g., vias that connect a top die to a bottom substrate directly) are fabricated using a crack-free laser-based drilling process. Drilled hole pitch and diameter can be chosen as per the desired application. A seed layer is formed on the surface and side walls of the drilled holes using sputtering or electroless plating. Through Glass Vias (TGVs) are subsequently filled with copper using an electroplating approach. Extra copper on the glass surface is then removed by polishing to leave the vias flush with the glass surface. A cavity of desired thickness that will ultimately house an EMIB-T or an active die is then drilled, followed by vias that will connect the embedded die to the bottom substrate. The EMIB-T or active die is then placed in the cavity and is encapsulated on the top with a dielectric. The dielectric can be a traditional build-up dielectric material such as ABF. A plasma etch process can then be used to remove the portions of a die-bonding film and expose TSV pads on the back side of the die. Front side processing then continues with polishing/grinding to reveal the embedded die pillars. The core vias are then drilled and a semi-additive process (SAP) is used to fill and form pads and traces on the front side. The resulting layer can serve as a reset or routing layer for HBM/FIVR integration. Subsequently, backside vias that connect the embedded die TSV pads are metallized followed by pad formation. A solder resist layer is then laminated on the front and backside. First level interconnect (FLI) bumps are then formed by standard process, and core vias are opened with litho and vias for fine die to die connection using a UV laser followed by a lithography-based plating process, such as a tin (Sn) plating process. Alternately, an Litho Via process can be used to create the FLI bumps. MLI formation is also performed. A solder resist opening is fabricated by exposure and develop to create via openings. Copper fill plating followed by Litho-based Sn bump formation can then be performed. A micro-ball bumping process can also be performed to create MLI bumps. In the case of multiple interposers, the interposers can then be singulated into units and sent to assembly for top die attach which is usually performed at unit level. In one embodiment, the glass in the interposer provides excellent co-planarity and tight alignment accuracy to ensure fine die-to-die (D2D) connections. Top die assembly can be performed using Thermal Compression Bonding (TCB) to attach the top die to the nested interposer. Underfill formation, over-mold formation and subsequent grind can then performed to expose a die back side and subsequent die backside metallization.

It is to be appreciated that glass-based nesting is described here, however, any material (e.g., Silicon, Ceramic, etc., that can provide stiffness) can be implemented. The presence of a cavity that houses an active die or EMIB with TSV connections and metallized vias in the interposer that connect these TSV connections to the bottom substrate will be uniquely visible in a final product. Such connections can be used to power an embedded die or for any other desired functionalities. Embodiments can be implemented to enable finer D2D tiling and a robust MLI attach of tiled die in various interconnect architectures. This can be enabled using a nested interposer architecture that can accommodate a thin EMIB-T or an active die for fine bump pitch D2D interconnections. Embodiments can be implemented by nesting the EMIB-T or active die in a cavity of desired thickness. The TSV connections of the die embedded in the cavity to the bottom substrate can be enabled through metallized vias fabricated beneath/under the cavity. Such connections can be used to power the embedded die or for any other desired functionalities. Other top die connections to bottom substrate can be handled through vias in the non-cavity regions of the interposer. In one embodiment, the nested interposer provides a low warpage and the MLI attach to the bottom substrate can be accomplished using a relatively inexpensive mass reflow process. It is to be appreciated that such heterogeneous die integration or die tiling/stitching can be implemented to extend Moore's Law.

Figure 4A:
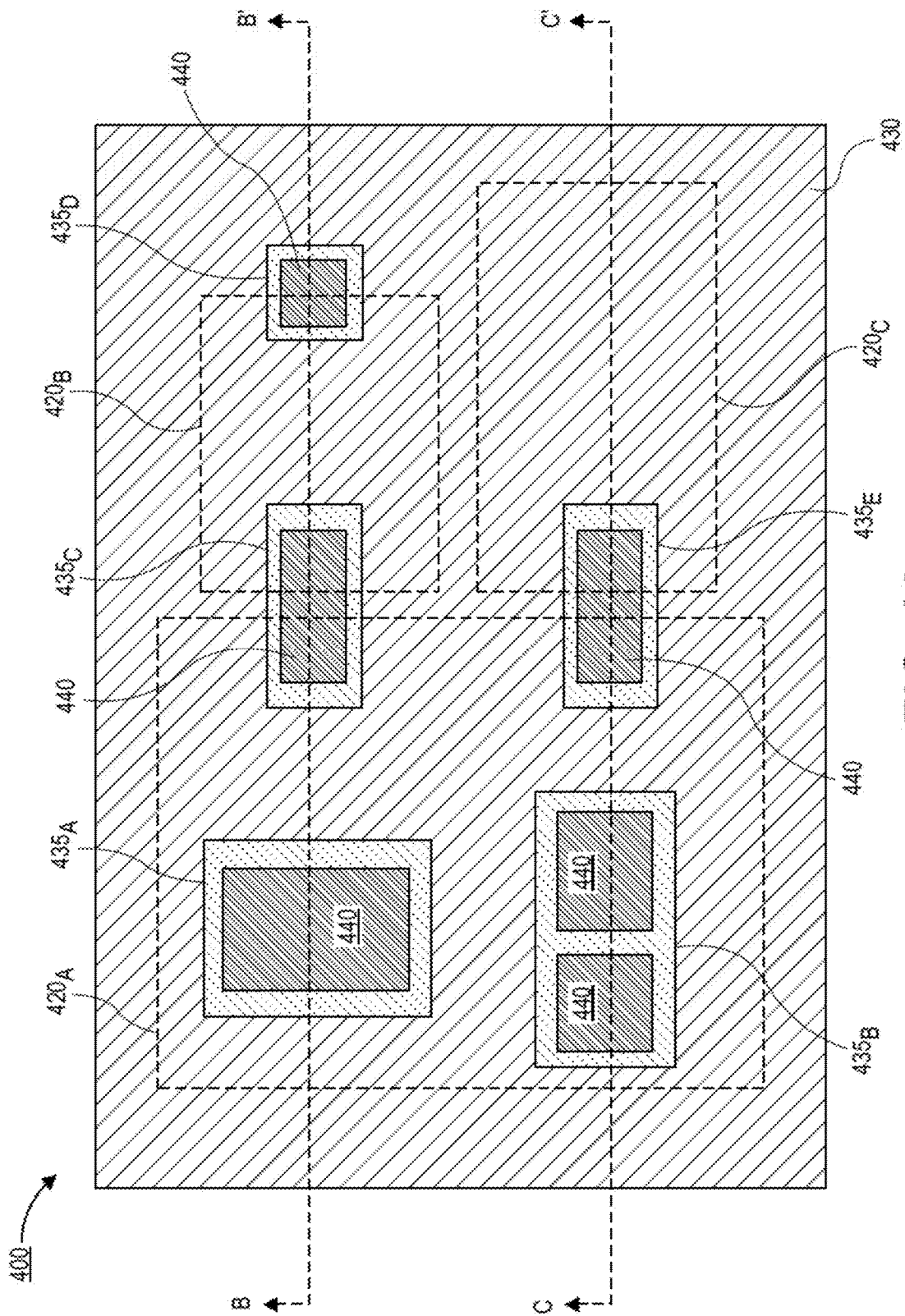
FIG. 4A is a plan view illustration of an electronic package with a heterogeneous nested interposer, in accordance with an embodiment.

In another aspect, referring now to FIG. 4A, a plan view illustration of an electronic package 400 is shown, in accordance with an exemplary embodiment. In an embodiment, the electronic package 400 includes an interposer 430 with a plurality of cavities $435_{A-E}$. In an embodiment, a plurality of nested components 440 are positioned in the cavities 435. It is to be appreciated that for ease of illustration, the cavities 435 are depicted as extending entirely through the interposer 430; however, in at least some embodiments, the cavities 435 extend only partially through and not entirely through the interposer 430. In some embodiments, at least one of the cavities 435 includes a plurality of nested components 440. For example, two nested components 440 are positioned in cavity $435_B$. In an embodiment, the cavities 435 may be entirely within a footprint of a die 420 (indicated by dashed lines), within the footprint of more than one die 420, and/or partially within the footprint of a single die 420. For example, cavities $435_A$ and $435_B$ are entirely within a footprint of die $420_A$, cavity $435_C$ is within the footprint of die $420_A$ and $420_B$, cavity $435_E$ is within the footprint of die $420_A$ and $420_C$, and cavity $435_D$ is partially within the footprint of die $420_B$.

Figure 4B:
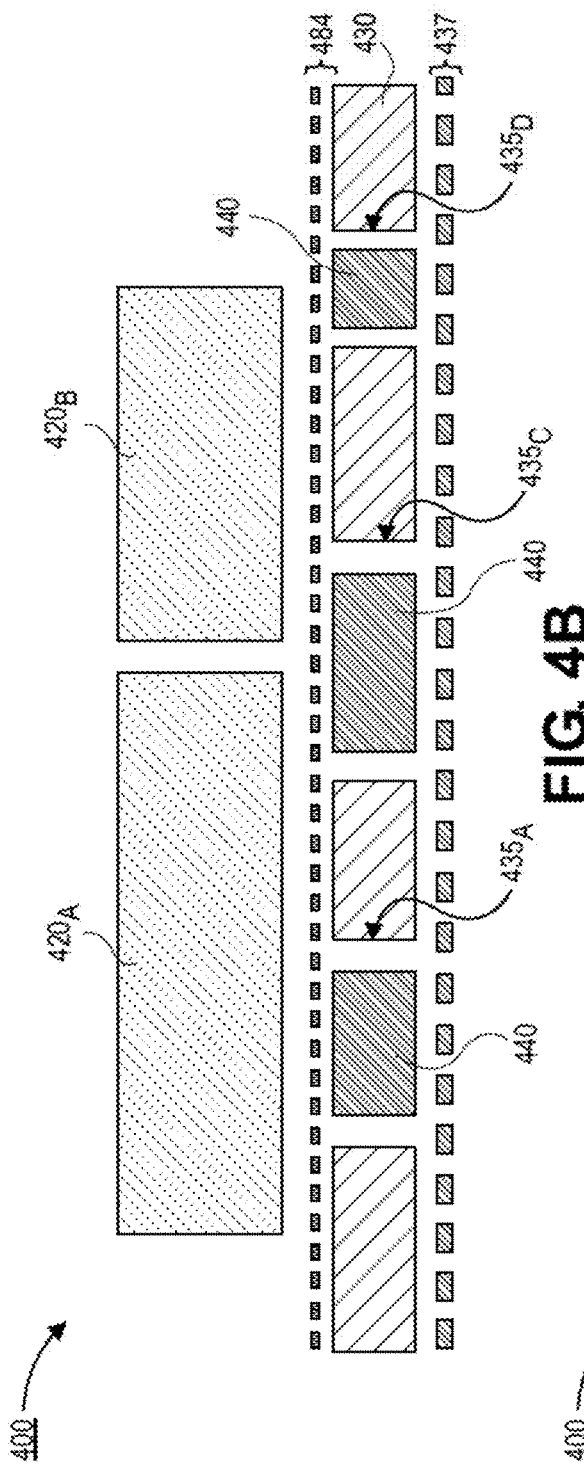
FIG. 4B is a cross-sectional illustration of the electronic package in FIG. 4A along line B-B', in accordance with an embodiment.

Referring now to FIG. 4B, a cross-sectional schematic illustration of the electronic package 400 in FIG. 4A along line B-B' is shown, in accordance with an embodiment. In the illustrated embodiment, the interposer 430 is shown with nested components 440 within cavities $435_A$, $435_C$, and $435_D$. The interposer 430 and the nested components 440 may be electrically coupled to the dies $420_A$ and $420_B$ by interconnects that include a layer of intermediate pads 484. The intermediate pads 484 are shown schematically between the dies $420_A$, $420_B$ and the interposer 430 and the nested components 440 for simplicity. However, it is to be appreciated that the intermediate pads 484 may be part of an interconnect substantially to the interconnects 181 and 182 described above with respect to FIGS. 1A-1C or interconnects 281 and 282 described above with respect to FIGS. 2A-2C. In an embodiment, the bottom surfaces of the interposer 430 and the nested components 440 may be electrically coupled to package side bumps 437.

Figure 4C:
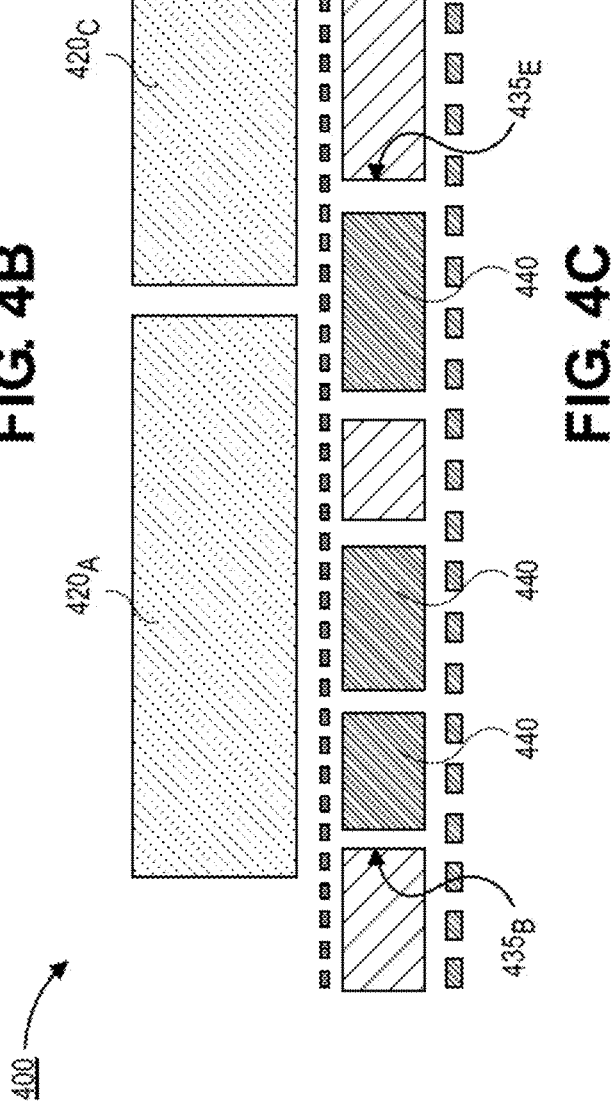
FIG. 4C is a cross-sectional illustration of the electronic package in FIG. 4A along line C-C', in accordance with an embodiment.

Referring now to FIG. 4C, a cross-sectional schematic illustration of the electronic package 400 in FIG. 4A along line C-C' is shown, in accordance with an embodiment. In the illustrated embodiment, the interposer 430 is shown with nested components 440 within cavities $435_B$ and $435_E$. The interposer 430 and the nested components 440 may be electrically coupled to the dies $420_A$ and $420_B$ by interconnects that include a layer of intermediate pads 484. The intermediate pads 484 are shown schematically between the dies $420_A$, $420_B$ and the interposer 430 and the nested components 440 for simplicity. However, it is to be appreciated that the intermediate pads 484 may be part of an interconnect substantially to the interconnects 181 and 182 described above with respect to FIGS. 1A-1C or interconnects 281 and 282 described above with respect to FIGS. 2A-2C. In an embodiment, the bottom surfaces of the interposer 430 and the nested components 440 may be electrically coupled to package side bumps 437.

Figure 5:
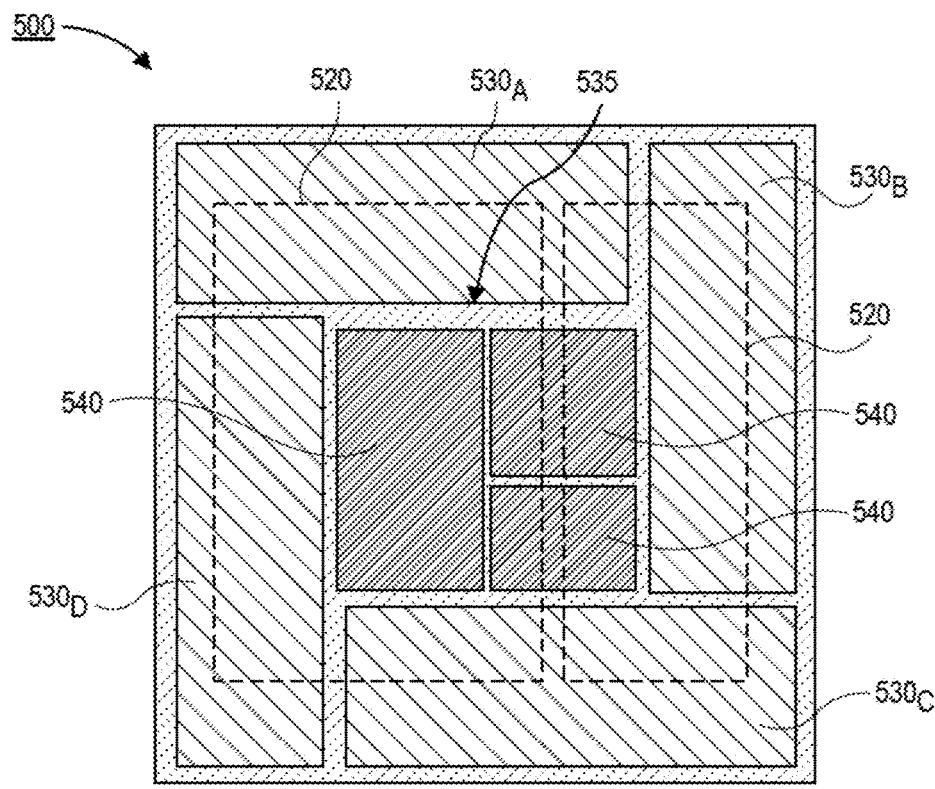
FIG. 5 is a plan view illustration of an electronic package with a heterogeneous nested interposer that includes a plurality of interposer substrates, in accordance with an embodiment.

In another aspect, referring now to FIG. 5, a plan view illustration of an electronic package 500 is shown, in accordance with an exemplary embodiment. In an embodiment, the electronic package 500 may include a plurality of interposers $530_{A-D}$. Each interposer 530 may be any shape. For example, the interposers 530 are illustrated as being rectilinear. The interposers 530 may be arranged so that sidewalls of the interposers 530 define a cavity 535. In an embodiment, one or more nested components 540 may be positioned in the cavity 535. In an embodiment, one or more dies 520 (indicated with dashed lines) may be provided above the interposers 530 and the nested components 540. Each of the dies 520 may extend over one or more of interposers 530.

In an embodiment, each of the interposers 530 may be substantially similar to each other. For example, each of the interposers 530 may be passive interposers 530 or active interposers 530. In other embodiments, the interposers 530 may not all be the same. For example, one or more of the interposers 530 may be an active interposer 530 and one or more of the interposers 530 may be a passive interposer.

In an embodiment, a nested interposer is attached to a bottom substrate (MLI Attach). The nested interposer with EMIB-T/active die with the assembled top die complex is then attached to the bottom substrate. The nested interposer can provide a low warpage and the attachment can be accomplished using a cheap mass reflow process. The resulting assembly can be attached to a board. As an example, FIG. 6 illustrates a cross-sectional view representing formation of an electronic system including a nested interposer having a through-silicon via bridge die, in accordance with an embodiment of the present disclosure.

Figure 6:
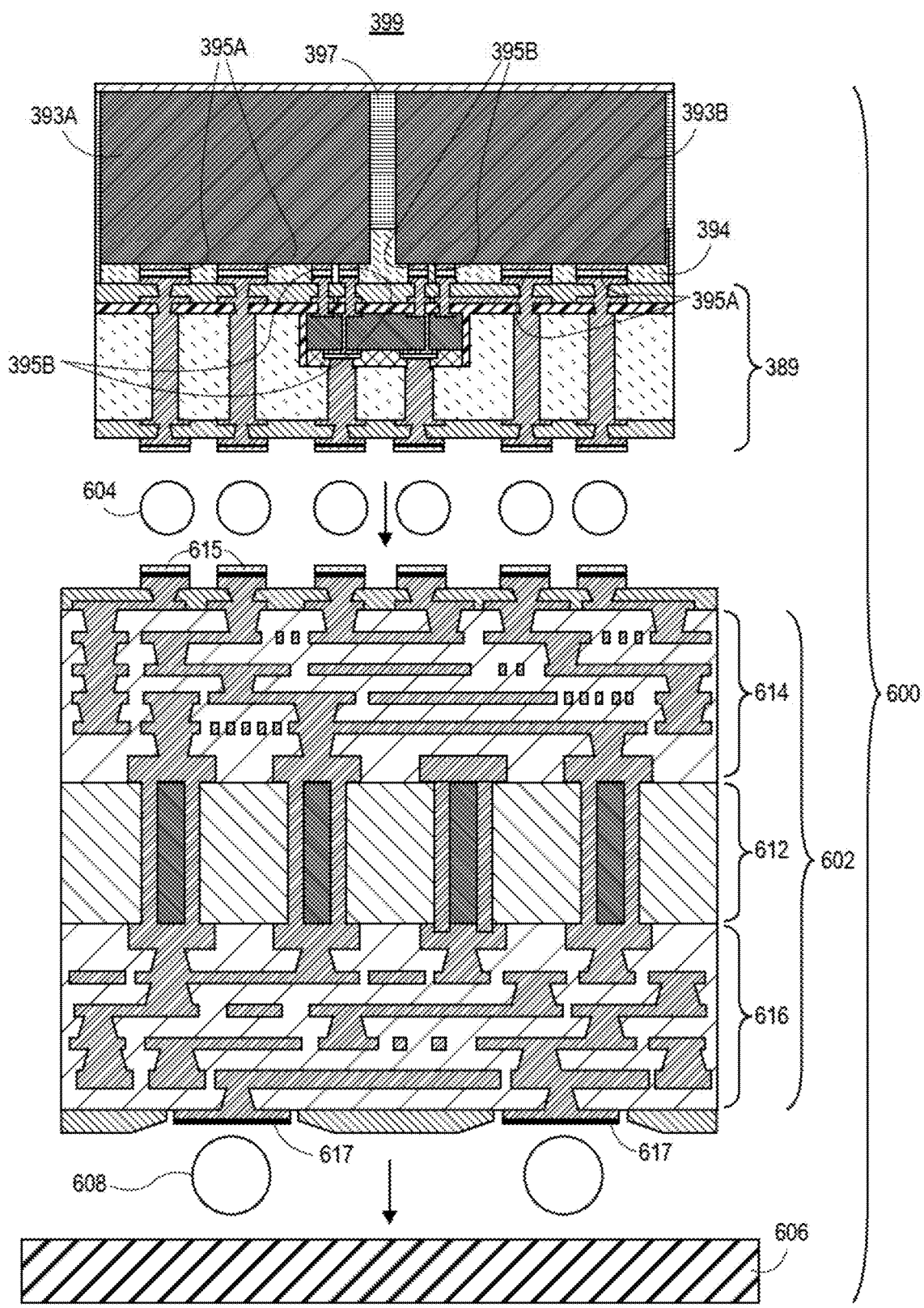
FIG. 6 illustrates a cross-sectional view representing formation of an electronic system including a nested interposer having a through-silicon via bridge die, in accordance with an embodiment of the present disclosure.

Referring to FIG. 6, an electronic assembly 600 is fabricated by coupling an assembly 399 (such as described above in association with FIG. 3K) to a package substrate 602, e.g., with solder balls 604 at bumps or pads 615 of the package substrate 602. The package substrate 602 is coupled to a board 606 (such as a printed circuit board (PCB)), e.g., with solder balls 608 at bumps or pads 617 of package substrate 602. In one embodiment, package substrate 602 includes a die side 614, a board side 616, and a core or direct routing layer 612. In some embodiments, the assembly 399 is coupled directly to the board 606. That is, the package substrate 602 may be optionally omitted.

Figure 7:
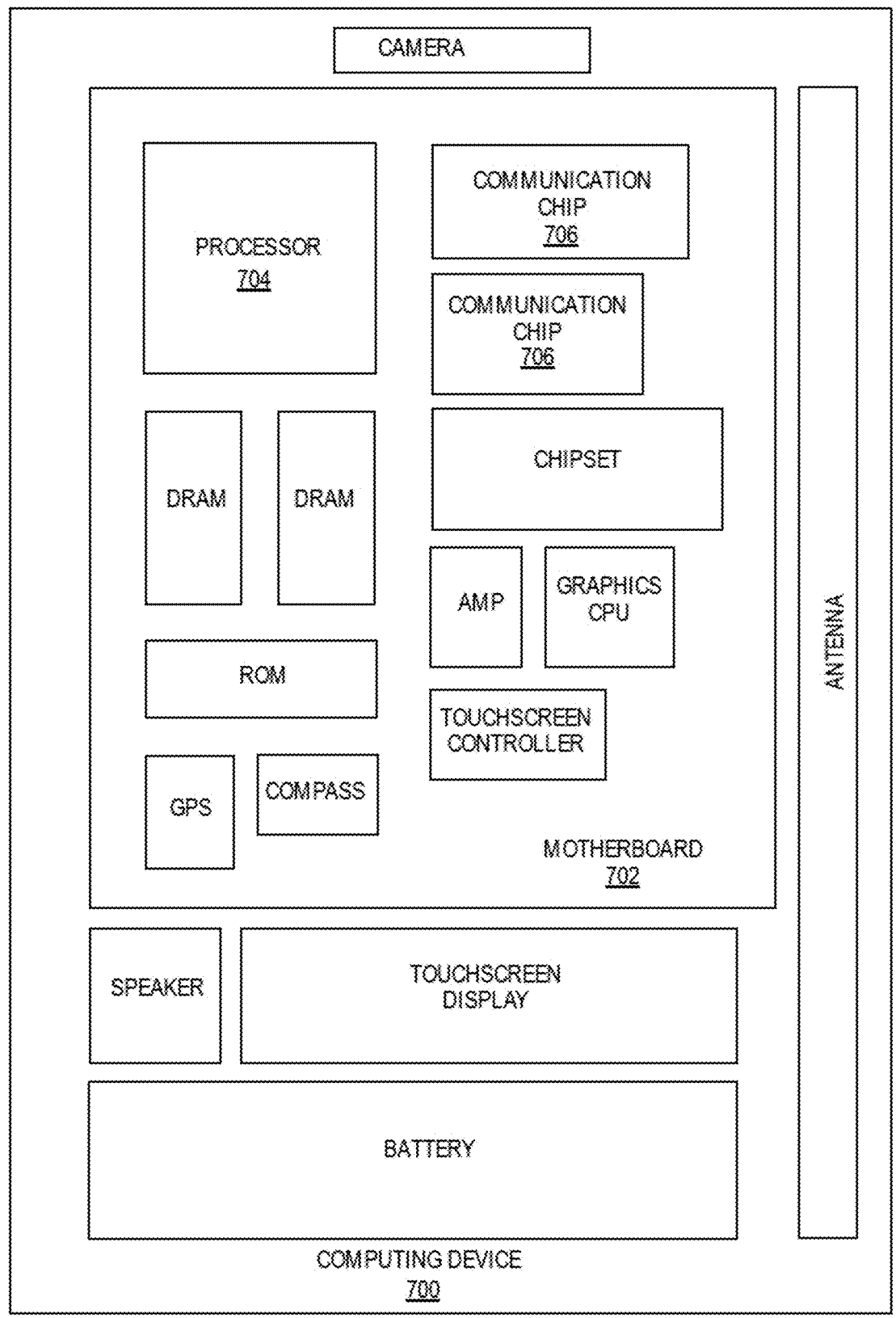
FIG. 7 is a schematic of a computing device built in accordance with an embodiment.

FIG. 7 illustrates a computing device 700 in accordance with one implementation of the disclosure. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the disclosure, the integrated circuit die of the processor may be packaged in an electronic system that includes a multi-chip package with an interposer and a nested component that are coupled to one or more dies by interconnects, in accordance with embodiments described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the disclosure, the integrated circuit die of the communication chip 706 may be packaged in an electronic system 700 that includes a multi-chip package with an interposer and a nested component that are coupled to one or more dies by interconnects, in accordance with embodiments described herein.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An electronic package includes an interposer having an interposer substrate, a cavity that passes into but not through the interposer substrate, a through interposer via (TIV) within the interposer substrate, and an interposer pad electrically coupled to the TIV. The electronic package includes a nested component in the cavity, wherein the nested component includes a component pad coupled to a through-component via. A core via is beneath the nested component, the core via extending from the nested component through the interposer substrate. A die is coupled to the interposer pad by a first interconnect and coupled to the component pad by a second interconnect.

Example embodiment 2: The electronic package of example embodiment 1, wherein the first interconnect and the second interconnect each include an intermediate pad, and a bump over the intermediate pad.

Example embodiment 3: The electronic package of example embodiment 1 or 2, further including a dielectric layer over and around the interposer and the nested component.

Example embodiment 4: The electronic package of example embodiment 3, wherein the intermediate pads are over a surface of the dielectric layer.

Example embodiment 5: The electronic package of example embodiment 4, wherein the intermediate pad of the first interconnect is coupled to the interposer pad by a first via that passes through a portion of the dielectric layer, and wherein the intermediate pad of the second interconnect is coupled to the component pad by a second via that passes through a portion of the dielectric layer.

Example embodiment 6: The electronic package of example embodiment 4, wherein the intermediate pad of the first interconnect is directly connected to the interposer pad, and wherein the intermediate pad of the second interconnect is directly connected to the component pad.

Example embodiment 7: The electronic package of example embodiment 1, 2, 3, 4, 5 or 6, wherein a centerline of the first interconnect is offset from a centerline of the interposer pad, and wherein a centerline of the second interconnect is offset from a centerline of the component pad.

Example embodiment 8: The electronic package of example embodiment 1, 2, 3, 4, 5, 6 or 7, wherein a first portion of the cavity is within a footprint of the die, and wherein a second portion of the cavity is outside of the footprint of the die.

Example embodiment 9: The electronic package of example embodiment 1, 2, 3, 4, 5, 6, 7 or 8, wherein the nested component is an active component.

Example embodiment 10: The electronic package of example embodiment 1, 2, 3, 4, 5, 6, 7, 8 or 9, further including a second die, wherein the second die is coupled to the nested component by a third interconnect, the third interconnect including an intermediate pad, and a bump over the intermediate pad.

Example embodiment 11: The electronic package of example embodiment 10, wherein the nested component electrically couples the first die to the second die.

Example embodiment 12: The electronic package of example embodiment 1, 2, 3, 4, 5, 6, 7, 8, 9, 10 or 11, wherein an active surface of the nested component faces towards the die.

Example embodiment 13: The electronic package of example embodiment 1, 2, 3, 4, 5, 6, 7, 8, 9, 10, 11 or 12, wherein the interposer substrate includes glass, ceramic, silicon, silicon carbide, alumina, or organic materials.

Example embodiment 14: An electronic system includes a board and an interposer electrically coupled to the board. The interposer includes a cavity that passes into but not through an interposer substrate, a nested component in the cavity, a through interposer via (TIV) within the interposer substrate, and a core via beneath the nested component, the core via extending from the nested component through the interposer substrate. A first die is electrically coupled to the interposer and the nested component by a first plurality of interconnects. A second die is electrically coupled to the interposer and the nested component by a second plurality of interconnects.

Example embodiment 15: The electronic system of example embodiment 14, wherein the nested component electrically couples the first die to the second die.

Example embodiment 16: The electronic system of example embodiment 14 or 15, further including a package substrate, wherein the package substrate is electrically coupled to the board, and wherein the interposer is electrically coupled to the package substrate.

Example embodiment 17: An electronic package includes an interposer having a glass substrate, a cavity that passes into but not through the glass substrate, a through glass via (TGV) within the glass substrate, and an interposer pad electrically coupled to the TGV. The electronic package includes a silicon bridge die in the cavity, wherein the silicon bridge die includes a silicon bridge die pad coupled to a through-silicon via. A core via is beneath the silicon bridge die, the core via extending from the silicon bridge die through the glass substrate. A die is coupled to the interposer pad by a first interconnect and coupled to the silicon bridge die pad by a second interconnect.

Example embodiment 18: The electronic package of example embodiment 17, wherein the first interconnect and the second interconnect each include an intermediate pad, and a bump over the intermediate pad.

Example embodiment 19: The electronic package of example embodiment 18 or 19, further including a dielectric layer over and around the interposer and the silicon bridge die.

Example embodiment 20: The electronic package of example embodiment 19, wherein the intermediate pads are over a surface of the dielectric layer.

Example embodiment 21: The electronic package of example embodiment 20, wherein the intermediate pad of the first interconnect is coupled to the interposer pad by a first via that passes through a portion of the dielectric layer, and wherein the intermediate pad of the second interconnect is coupled to the silicon bridge die pad by a second via that passes through a portion of the dielectric layer.

Example embodiment 22: The electronic package of example embodiment 20, wherein the intermediate pad of the first interconnect is directly connected to the interposer pad, and wherein the intermediate pad of the second interconnect is directly connected to the silicon bridge die pad.

Example embodiment 23: The electronic package of example embodiment 17, 18, 19, 20, 21 or 22, wherein a centerline of the first interconnect is offset from a centerline of the interposer pad, and wherein a centerline of the second interconnect is offset from a centerline of the silicon bridge die pad.

Example embodiment 24: The electronic package of example embodiment 17, 18, 19, 20, 21, 22 or 23, wherein a first portion of the cavity is within a footprint of the die, and wherein a second portion of the cavity is outside of the footprint of the die.

Example embodiment 25: The electronic package of example embodiment 17, 18, 19, 20, 21, 22, 23 or 24, further including a second die, wherein the second die is coupled to the silicon bridge die by a third interconnect, the third interconnect including an intermediate pad, and a bump over the intermediate pad.

What is claimed is:

1. An electronic package, comprising:
    an interposer, wherein the interposer comprises:
        an interposer substrate;
        a cavity that passes into but not through the interposer substrate;
        a through interposer via (TIV) within the interposer substrate;
        an interposer pad electrically coupled to the TIV; and
        a first backside pad coupled to the TIV;
    a nested component in the cavity, wherein the nested component comprises a component pad coupled to a through-component via;
    a core via beneath the nested component, the core via extending from the nested component through the interposer substrate to a second backside pad, the second backside pad laterally spaced apart from the first backside pad, and the second backside pad separate and distinct from the first backside pad; and
    a die coupled to the interposer pad by a first interconnect and coupled to the component pad by a second interconnect.

2. The electronic package of claim 1, wherein the first interconnect and the second interconnect each comprise:
    an intermediate pad; and
    a bump over the intermediate pad.

3. The electronic package of claim 2, further comprising:
    a dielectric layer over and around the interposer and the nested component.

4. The electronic package of claim 3, wherein the intermediate pads are over a surface of the dielectric layer.

5. The electronic package of claim 4, wherein the intermediate pad of the first interconnect is coupled to the interposer pad by a first via that passes through a portion of the dielectric layer, and wherein the intermediate pad of the second interconnect is coupled to the component pad by a second via that passes through a portion of the dielectric layer.

6. The electronic package of claim 4, wherein the intermediate pad of the first interconnect is directly connected to the interposer pad, and wherein the intermediate pad of the second interconnect is directly connected to the component pad.

7. The electronic package of claim 1, wherein a centerline of the first interconnect is offset from a centerline of the interposer pad, and wherein a centerline of the second interconnect is offset from a centerline of the component pad.

8. The electronic package of claim 1, wherein a first portion of the cavity is within a footprint of the die, and wherein a second portion of the cavity is outside of the footprint of the die.

9. The electronic package of claim 1, wherein the nested component is an active component.

10. The electronic package of claim 1, further comprising:
    a second die, wherein the second die is coupled to the nested component by a third interconnect comprising:
        an intermediate pad; and
        a bump over the intermediate pad.

11. The electronic package of claim 10, wherein the nested component electrically couples the first die to the second die.

12. The electronic package of claim 1, wherein an active surface of the nested component faces towards the die.

13. The electronic package of claim 1, wherein the interposer substrate comprises glass, ceramic, silicon, silicon carbide, alumina, or organic materials.

14. An electronic system, comprising:
    a board;
    an interposer electrically coupled to the board, wherein the interposer comprises a cavity that passes into but not through an interposer substrate, a nested component in the cavity, a through interposer via (TIV) within the interposer substrate and coupled to a first backside pad, and a core via beneath the nested component, the core via extending from the nested component through the interposer substrate to a second backside pad, the second backside pad laterally spaced apart from the first backside pad, and the second backside pad separate and distinct from the first backside pad;
    a first die electrically coupled to the interposer and the nested component by a first plurality of interconnects; and
    a second die electrically coupled to the interposer and the nested component by a second plurality of interconnects.

15. The electronic system of claim 14, wherein the nested component electrically couples the first die to the second die.

16. The electronic system of claim 14, further comprising:
    a package substrate, wherein the package substrate is electrically coupled to the board, and wherein the interposer is electrically coupled to the package substrate.

17. An electronic package, comprising:
    an interposer, wherein the interposer comprises:
        a glass substrate;
        a cavity that passes into but not through the glass substrate;
        a through glass via (TGV) within the glass substrate;
        an interposer pad electrically coupled to the TGV; and
        a first backside pad coupled to the TIV;
    a silicon bridge die in the cavity, wherein the silicon bridge die comprises a silicon bridge die pad coupled to a through-silicon via;
    a core via beneath the silicon bridge die, the core via extending from the silicon bridge die through the glass substrate to a second backside pad, the second backside pad laterally spaced apart from the first backside pad, and the second backside pad separate and distinct from the first backside pad; and
    a die coupled to the interposer pad by a first interconnect and coupled to the silicon bridge die pad by a second interconnect.

18. The electronic package of claim 17, wherein the first interconnect and the second interconnect each comprise:
    an intermediate pad; and
    a bump over the intermediate pad.

19. The electronic package of claim 18, further comprising:
    a dielectric layer over and around the interposer and the silicon bridge die.

20. The electronic package of claim 19, wherein the intermediate pads are over a surface of the dielectric layer.

21. The electronic package of claim 20, wherein the intermediate pad of the first interconnect is coupled to the interposer pad by a first via that passes through a portion of the dielectric layer, and wherein the intermediate pad of the second interconnect is coupled to the silicon bridge die pad by a second via that passes through a portion of the dielectric layer.

22. The electronic package of claim 20, wherein the intermediate pad of the first interconnect is directly connected to the interposer pad, and wherein the intermediate pad of the second interconnect is directly connected to the silicon bridge die pad.

23. The electronic package of claim 17, wherein a centerline of the first interconnect is offset from a centerline of the interposer pad, and wherein a centerline of the second interconnect is offset from a centerline of the silicon bridge die pad.

24. The electronic package of claim 17, wherein a first portion of the cavity is within a footprint of the die, and wherein a second portion of the cavity is outside of the footprint of the die.

25. The electronic package of claim 17, further comprising:
    a second die, wherein the second die is coupled to the silicon bridge die by a third interconnect comprising:
        an intermediate pad; and
        a bump over the intermediate pad.

\* \* \* \* \*